(12) United States Patent
Choi et al.

(10) Patent No.: US 7,929,337 B2
(45) Date of Patent: Apr. 19, 2011

(54) PHASE-CHANGE RANDOM ACCESS MEMORIES CAPABLE OF SUPPRESSING COUPLING NOISE DURING READ-WHILE-WRITE OPERATION

(75) Inventors: Byung-gil Choi, Yongin-si (KR); Beak-hyung Cho, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 65 days.

(21) Appl. No.: 12/379,398

(22) Filed: Feb. 20, 2009

(65) Prior Publication Data

US 2009/0213646 A1 Aug. 27, 2009

(30) Foreign Application Priority Data

Feb. 21, 2008 (KR) .................. 10-2008-0015918

(51) Int. Cl.
*G11C 11/00* (2006.01)
*G11C 5/02* (2006.01)
*G11C 5/06* (2006.01)
*G11C 7/10* (2006.01)

(52) U.S. Cl. ........ 365/163; 365/51; 365/63; 365/189.04
(58) Field of Classification Search ............. 365/189.04, 365/163
See application file for complete search history.

(56) References Cited

U.S. PATENT DOCUMENTS

| | | | |
|---|---|---|---|
| 5,847,994 A * | 12/1998 | Motoshima et al. | 365/185.11 |
| 6,937,505 B2 * | 8/2005 | Morikawa | 365/158 |
| 6,990,015 B2 * | 1/2006 | Honda et al. | 365/173 |
| 7,190,615 B2 * | 3/2007 | Fujito et al. | 365/185.05 |
| 7,206,216 B2 * | 4/2007 | Osada et al. | 365/148 |
| 7,339,825 B2 * | 3/2008 | Iioka et al. | 365/185.13 |
| 2001/0002882 A1 * | 6/2001 | Shimazaki et al. | 365/51 |
| 2005/0185445 A1 * | 8/2005 | Osada et al. | 365/148 |
| 2006/0034141 A1 * | 2/2006 | Iioka et al. | 365/230.03 |
| 2006/0083045 A1 * | 4/2006 | Kamoshida et al. | 365/63 |
| 2006/0092724 A1 * | 5/2006 | Kanda | 365/200 |

FOREIGN PATENT DOCUMENTS

| | | |
|---|---|---|
| JP | 2004-086986 | 3/2004 |
| JP | 2005-158199 | 6/2005 |
| JP | 2006-514440 | 4/2006 |

* cited by examiner

*Primary Examiner* — Son L Mai
(74) *Attorney, Agent, or Firm* — Harness, Dickey & Pierce, PLC

(57) ABSTRACT

A semiconductor memory device includes at least one write global bit line connected to a plurality of local bit lines and at least one read global bit line connected to the local bit lines. The phase-change memory device having the write global bit line and the read global bit line suppress coupling noise generated during a read-while-write operation.

12 Claims, 10 Drawing Sheets

PHASE-CHANGE RANDOM ACCESS MEMORIES CAPABLE OF SUPPRESSING COUPLING NOISE DURING READ-WHILE-WRITE OPERATION

PRIORITY STATEMENT

This non-provisional U.S. patent application claims priority under 35 U.S.C. §119 to Korean Patent Application No. 10-2008-0015918, filed on Feb. 21, 2008, in the Korean Intellectual Property Office, the entire contents of which is incorporated herein by reference.

BACKGROUND

Conventional semiconductor memory devices may employ read-while-write operations. In a read-while-write operation, a read operation is performed to a bank or memory area, while a write operation is performed to another bank or memory area. In a conventional phase-change memory device in which banks are arranged vertically (e.g., in a stack structure), a read operation is performed to a bank in one layer, while a write operation is performed to bank in a different layer. Conventionally, during a read-while-write operation, a write voltage is applied to a global bit line and a read voltage is applied to another global bit line Read-while-write operations may increase the integrity and/or speed of phase-change (or other) memory devices. But, when two global bit lines are positioned relatively close to one another, coupling noise may be generated due to the concurrent or simultaneous application of the write and read voltages, which are different from one another. The coupling noise may change a value of data stored in a memory cell thereby decreasing reliability of the semiconductor memory device.

SUMMARY

Example embodiments relate to semiconductor memory devices, for example, phase-change memory devices capable of suppressing and/or preventing coupling noise occurring during a read-while-write operation in the phase-change memory device.

According to an example embodiment, a semiconductor memory device may include at least one write global bit line connected to a plurality of local bit lines and at least one read global bit line connected to the plurality of local bit lines. According to at least some example embodiments, the plurality of local bit lines may be arranged between the write global bit line and the read global bit line.

The semiconductor memory device may further include a plurality of memory banks. The plurality of banks may have a stack structure. The semiconductor memory device may be a phase change memory device. The semiconductor memory device may further include a shielding unit or circuit arranged between adjacent (or neighboring) write and read global bit lines. A ground voltage may be applied to the shielding unit. Alternatively, a power voltage or a boosted voltage may be applied to the shielding unit.

The adjacent (or neighboring) write and read global bit lines may be separated by a given distance. If the semiconductor memory device includes a plurality of write global bit lines and/or read global bit lines, the given distance may be greater than a distance between adjacent (or neighboring) write global bit lines and/or a distance between adjacent (or neighboring) read global bit lines.

The semiconductor memory device may include a plurality of write global bit lines. Adjacent (or neighboring) ones of the plurality of write global bit lines may be grouped into first and second write global bit line groups. The at least one read global bit line may be positioned between the first write global bit line group and the second write global bit line group.

The semiconductor memory device may include a plurality of write global bit lines and a plurality of read global bit lines. Adjacent (or neighboring) ones of the plurality of write global bit lines may be grouped into first and second write global bit line groups. Adjacent (or neighboring) ones of the plurality of read global bit lines may be grouped into first and second read global bit line groups. The write global bit line groups and the read global bit line groups may be alternately positioned.

The semiconductor memory device may include a plurality of write global bit lines and a plurality of read global bit lines. The plurality of write global bit lines and the plurality of read global bit lines may be alternately positioned. Alternatively, the plurality of write global bit lines may be positioned adjacent to one another and the plurality of read global bit lines may be positioned adjacent to one another.

According to another example embodiment, a semiconductor memory device may include at least one write global bit line connected to a plurality of local bit lines and at least one read global bit line connected to the plurality of local bit lines. Each of the plurality of local bit lines may be connected to a first bit line selection unit configured to activate a local bit line during a write operation, and a second bit line selection unit configured to activate a local bit line during a read operation.

According to example embodiments, each local bit line may be connected to a pair of first selection units, but only a single second selection unit. The first selection units in the pair of first selection units may be arranged at opposite ends of the local bit lines. The first selection unit may include a plurality of first bit line selection units, and each of the second selection units may include a plurality of second bit line selection units. Each of the plurality of first bit line selection units may be connected to a corresponding one of the plurality of local bit lines. Each of the plurality of second bit line selection units may be connected to a corresponding one of the plurality of local bit lines. The plurality of first bit line selection units and the plurality of second bit line selection units may be connected to the plurality of local bit lines at opposite ends of the plurality of local bit lines.

The plurality of local bit lines may be connected to a plurality of memory cells, which may be grouped into a first sub-memory cell array and a second sub-memory cell array. The first selection unit and the second selection unit may be positioned between the first sub-memory cell array and the second sub-memory cell array. A pair of first selection units and a pair of second selection units may be connected to each of the plurality of local bit lines.

BRIEF DESCRIPTION OF THE DRAWINGS

Example embodiments will be more clearly understood from the following detailed description taken in conjunction with the accompanying drawings in which.

DETAILED DESCRIPTION OF EXAMPLE EMBODIMENTS

Figure 1:
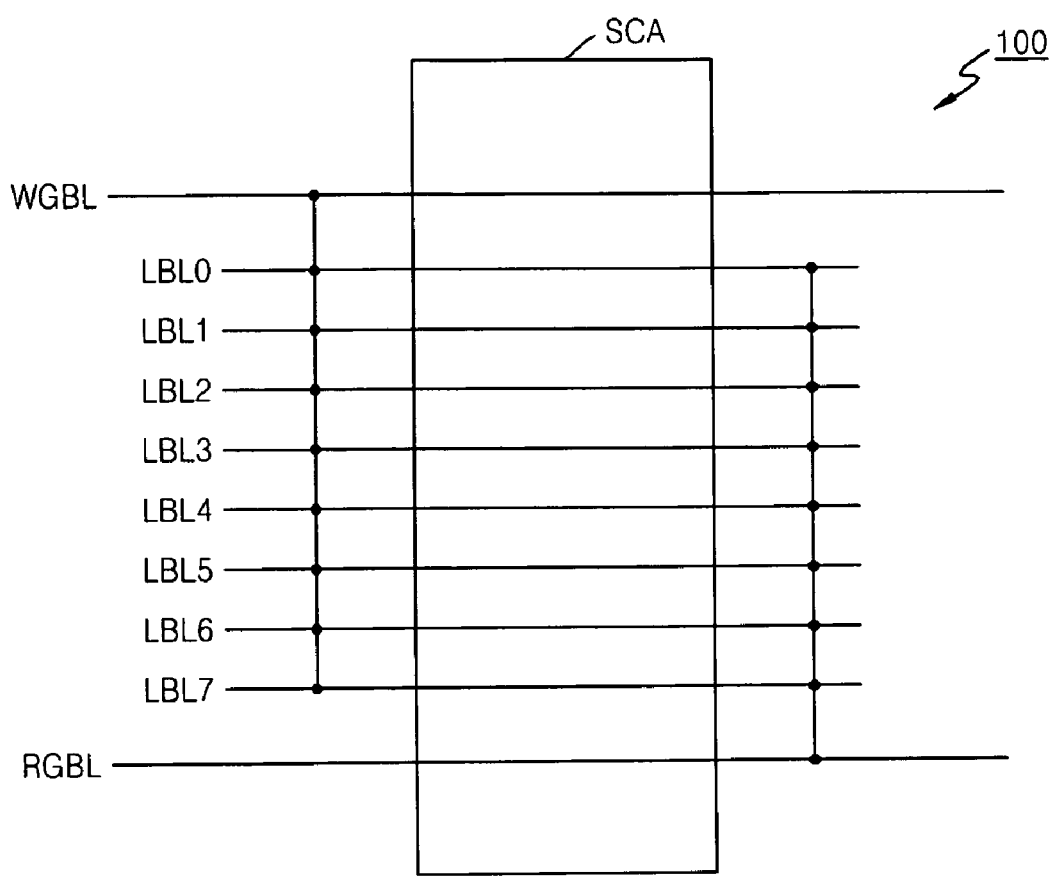
FIG. 1 illustrates a semiconductor memory device according to an example embodiment.

Various example embodiments of the present invention will now be described more fully with reference to the accompanying drawings in which some example embodiments of the invention are shown.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

The attached drawings for illustrating example embodiments are referred to in order to gain a sufficient understanding of the inventive concept, the merits thereof, and the objectives accomplished by the implementation of the inventive concept. Hereinafter, the inventive concept will be described in detail by explaining example embodiments of the inventive concept with reference to the attached drawings. Like reference numerals in the drawings denote like elements.

FIG. 1 illustrates a semiconductor memory device 100 according to an example embodiment. Referring to FIG. 1, the semiconductor memory device 100 may include a plurality of local bit lines LBL0-LBL7 connected to a plurality of sub-cell arrays (SCAs) positioned in a given area. The semiconductor memory device 100 may further include at least one write global bit line WGBL connected to each of the local bit lines LBL0-LBL7 and at least one read global bit line RGBL connected to each of the local bit lines LBL0-LBL7. As shown in FIG. 1, the write global bit line WGBL and the read global bit line RGBL may be connected to the local bit lines LBL0-LBL7 at opposite sides of the sub-cell array SCA. In one example, the write global bit line WGBL and the read global bit line RGBL may be connected to opposite ends of the local bit lines LBL0-LBL7. The semiconductor memory device 100 may be a phase-change or similar memory device.

Figure 2:
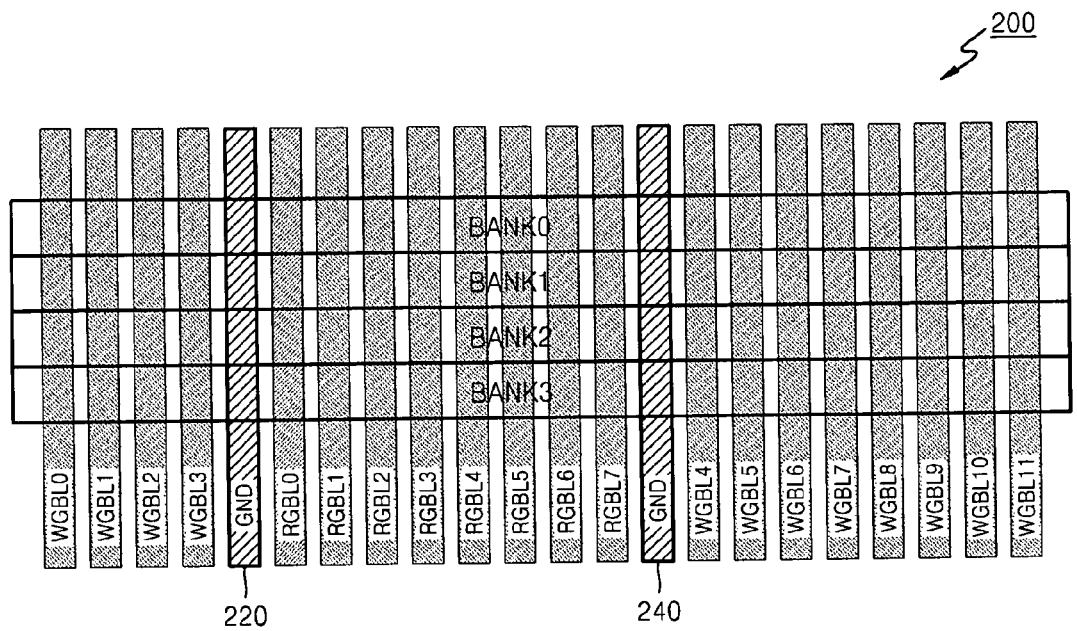
FIG. 2 illustrates a semiconductor memory device according to another example embodiment.

FIG. 2 illustrates a semiconductor memory device according to another example embodiment. As shown in FIG. 2, a plurality of banks BANK0-BANK3 may be arranged in a stack structure.

Referring to FIG. 2, the semiconductor memory device 200 may include a plurality of banks BANK0-BANK3 arranged in a stack structure. A shielding unit 220 may be arranged between a first group of adjacent (or neighboring) write global bit lines WGBL0-WGBL3 and a group of adjacent (or neighboring) read global bit lines RGBL0-RGBL7. In the example embodiment shown in FIG. 2, the shielding unit 220 is arranged between the write global bit line WGBL3 and the read global bit line RGBL0. The write global bit line WGBL3 and the read global bit line RGBL0 are adjacent to (or neighbor) one another. The semiconductor memory device 200 may further include a shielding unit 240 arranged between the group of adjacent (or neighboring) read global bit lines RGBL0-RGBL7 and a second group of adjacent write global bit lines WGBL4-WGBL11. In the example embodiment shown in FIG. 2, the shielding unit 240 is arranged between the write global bit line WGBL4 and the read global bit line RGBL7. The write global bit line WGBL4 and the read global bit line RGBL7 are adjacent to (or neighbor) one another. A ground voltage GND may be applied to the shielding units 220 and 240 in FIG. 2.

When the shielding units 220 and 240 are arranged between the adjacent (or neighboring) write global bit line WGBL3 and read global bit line RGBL0 and between the adjacent (or neighboring) write global bit line WGBL4 and read global bit line RGBL7, respectively, coupling noise may be suppressed (e.g., prevented or minimized) when performing a read operation to, for example, the second bank BANK1 via the first read global bit line RGBL0 concurrently or simultaneously with a write operation to, for example, the first bank BANK0 through the fourth write global bit line WGBL3.

Figure 3:
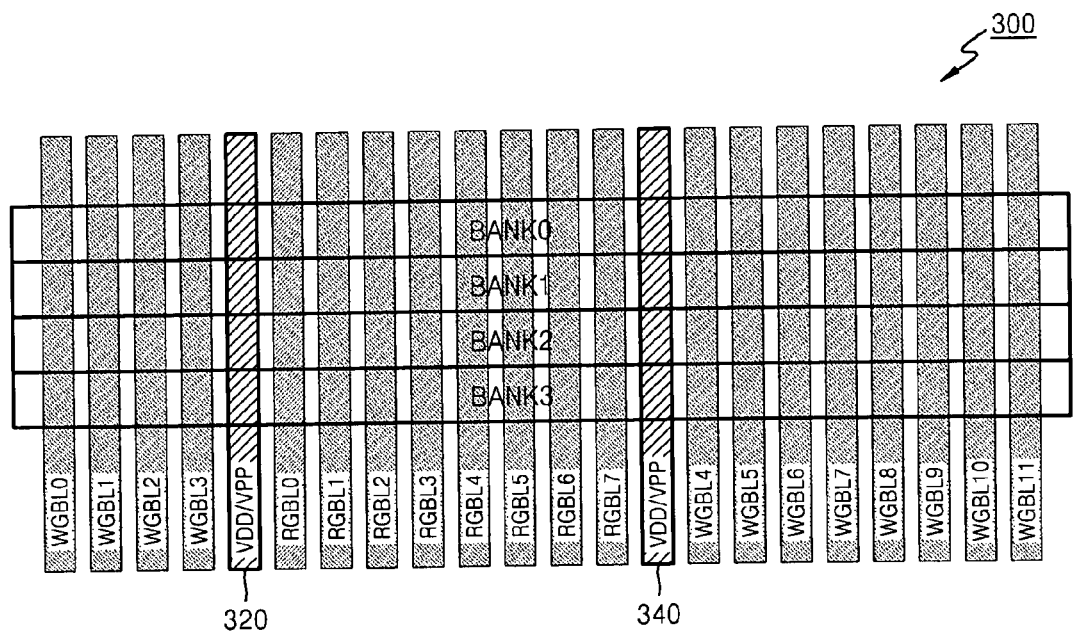
FIG. 3 illustrates a semiconductor memory device according to another example embodiment.

FIG. 3 illustrates a semiconductor memory device according to another example embodiment.

Referring to FIG. 3, the semiconductor memory device 300 may include a plurality of banks BANK0-BANK3 arranged in a stack structure. A shielding unit 320 may be arranged between the first group of adjacent write global bit lines WGBL0-WGBL3 and a group of adjacent read global bit lines RGBL0-RGBL7. In this example embodiment, the shielding unit 320 is arranged between the write global bit line WGBL3 and the read global bit line RGBL0. The write global bit line WGBL3 and the read global bit line RGBL0 are neighboring or adjacent global bit lines. The semiconductor memory device 300 may further include a shielding unit 340 arranged between the group of adjacent (or neighboring) read global bit lines RGBL0-RGBL7 and a second group of adjacent (or neighboring) write global bit lines WGBL4-WGBL11. In this example embodiment, the shielding unit 340 is arranged between the write global bit line WGBL4 and the read global bit line RGBL7. The write global bit line WGBL4 and the read global bit line RGBL7 are adjacent to (or neighbor) one another. In the semiconductor memory device 300, a power voltage VDD or a boosted voltage VPP may be applied to shielding units 320 and 340.

Figure 4:
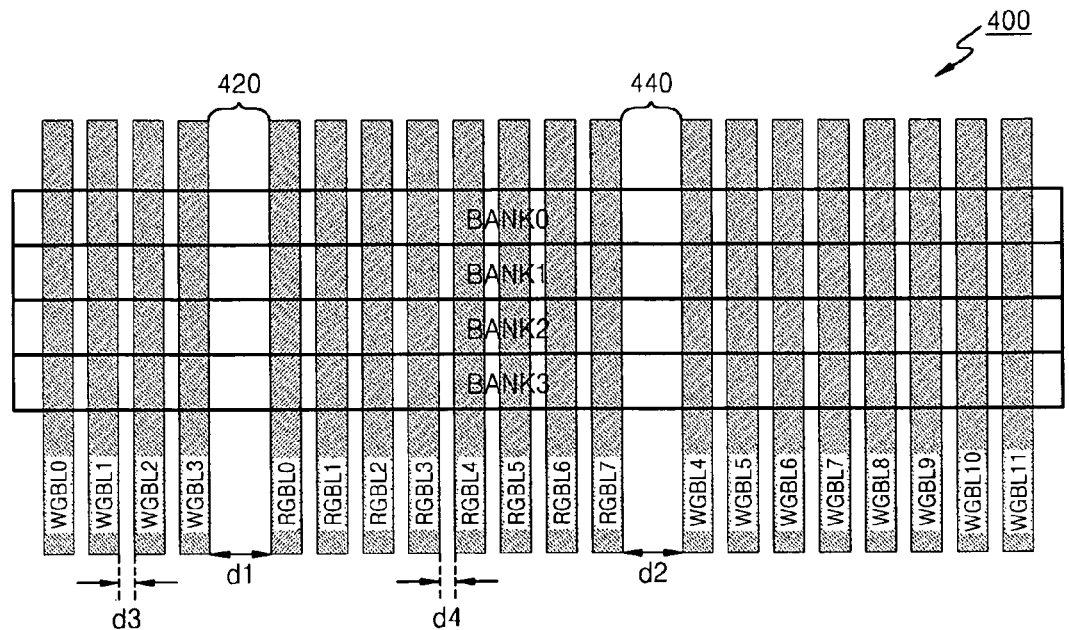
FIG. 4 illustrates a semiconductor memory device according to another example embodiment.

FIG. 4 illustrates a semiconductor memory device according to another example embodiment.

Referring to FIG. 4, in the semiconductor memory device 400 the first group of adjacent (or neighboring) write global bit lines WGBL0-WGBL3 may be separated from the group of adjacent (or neighboring) read global bit lines RGBL0-RGBL7 by a first distance d1. In this example embodiment, the write global bit line WGBL3 is separated from the read global bit line RGBL0 by the first distance d1.

The group of adjacent (or neighboring) read global bit lines RGBL0-RGBL7 may be separated from a second group of adjacent (or neighboring) write global bit lines WGBL4-WGBL11 by a second distance d2. In this example embodiment, write global bit line WGBL4 is separated from the read global bit line RGBL7 by the second distance d2.

The distances d1 and/or d2 may be greater than a distance d3 between adjacent (or neighboring) write global bit lines (e.g., WGBL1 and WGBL2) and/or a distance d4 between adjacent (or neighboring) read global bit lines (e.g., RGBL3 and RGBL4).

Figure 5A:
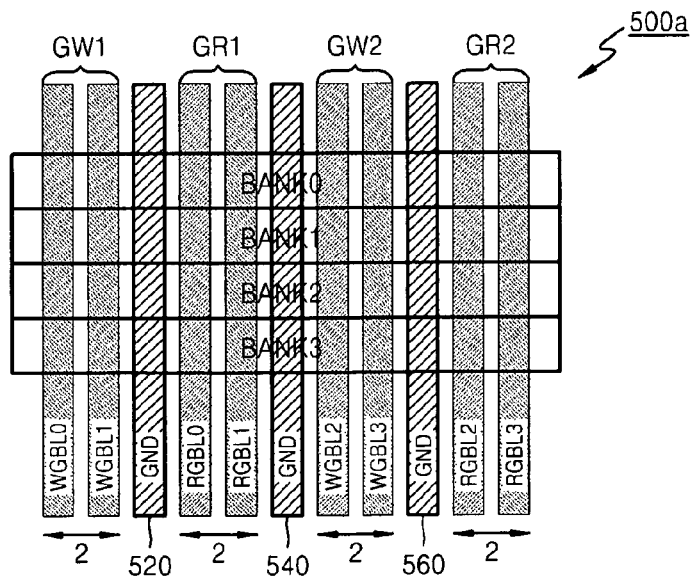
FIGS. 5A-5C illustrate semiconductor memory devices according to other example embodiment.
Figure 5B:
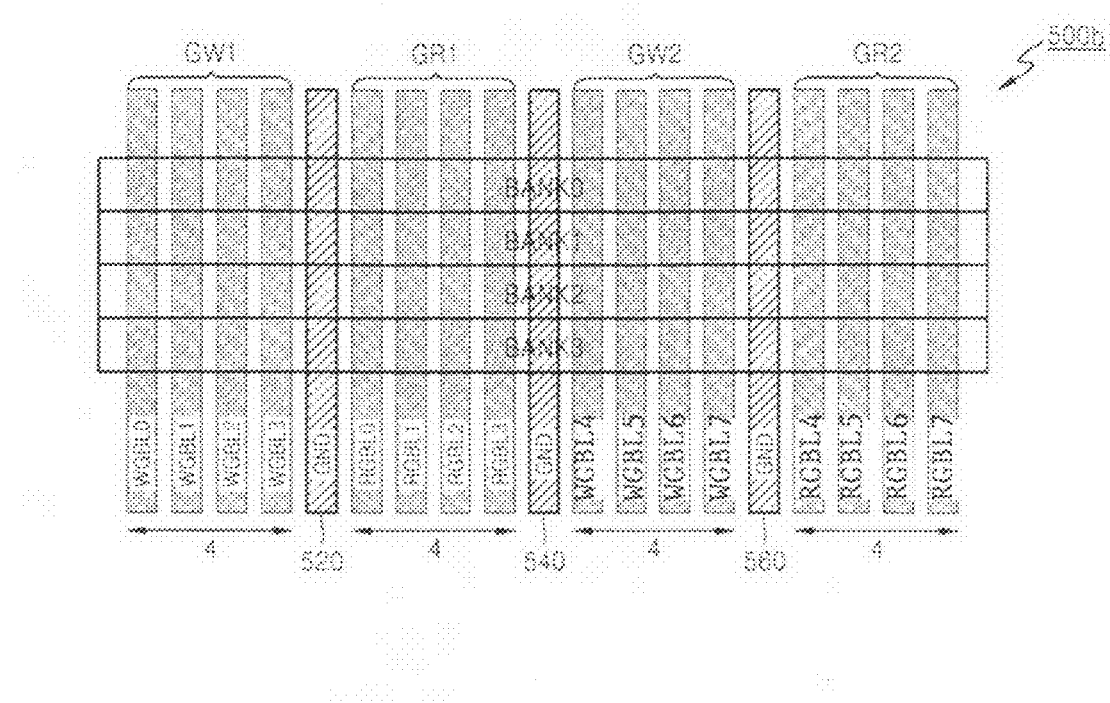
Figure 5C:
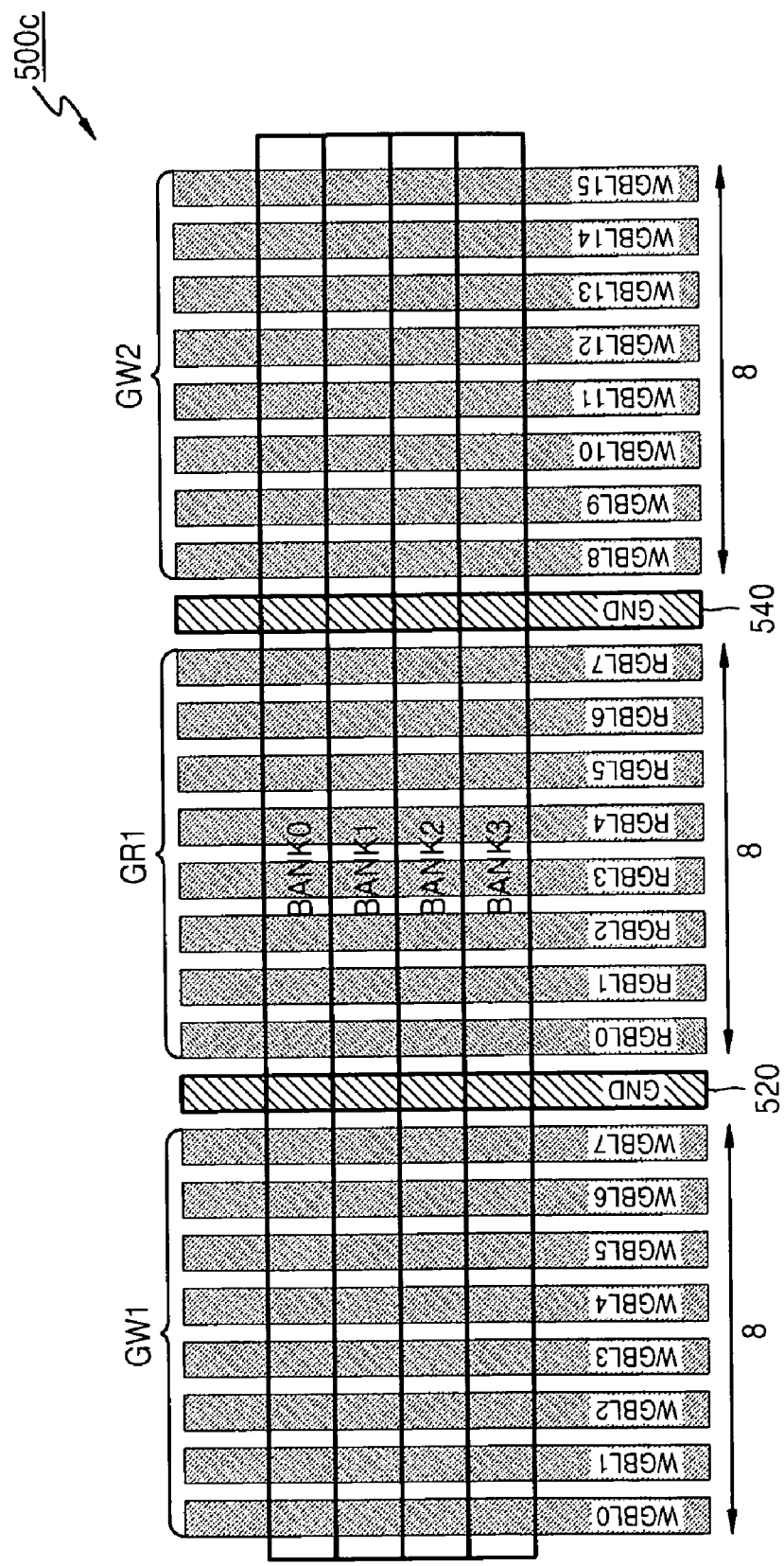

FIGS. 5A-5C illustrate semiconductor memory devices according to other example embodiments.

Referring to FIG. 5A, the semiconductor memory device 500a includes a plurality of write global bit line groups GW1, GW2, and a plurality of read global bit line groups GR1, GR2. Each of the plurality write global bit line groups GW1, GW2 may include a plurality of write global bit lines. Each of the read global bit line groups GR1, GR2 may include a plurality of read global bit lines. In the example embodiment shown in FIG. 5A, each of the plurality of write global bit line groups GW1, GW2 and each of the plurality of read global bit line groups GR1, GR2 includes two global bit lines. For example, the first write global bit line group GW1 includes write global bit lines WGBL0 and WGBL1, the first read global bit line group GR1 includes read global bit lines RGBL0 and RGBL1, the second write global bit line group GW2 includes write global bit lines WGBL2 and WGBL3, and the second read global bit line group GR2 includes read global bit lines RGBL2 and RGBL3. The write global bit line groups GW1, GW2 and the read global bit line groups GR1, GR2 may be alternately positioned such that each write global bit line group neighbors at least one read global bit line group. For example, as shown in FIG. 5A, the first write global bit line group GW1, the first read global bit line group GR1, the second write global bit line group GW2, and the second read global bit line group GR2 may be positioned sequentially.

In this example embodiment, adjacent (or neighboring) write and read global bit line groups GW1 and GR2 are separated by a shielding unit 520. Adjacent (or neighboring) read and write global bit line groups GR1 and GW2 are separated by a shielding unit 540. Adjacent (or neighboring) write and read global bit line groups GW2 and GR2 are separated by a shielding unit 560. Thus, as shown in FIG. 5A, shielding units 520, 540, and 560 may be arranged between respective global bit line groups.

Referring to FIG. 5B, the semiconductor memory device 500b is similar to the semiconductor memory device 500a shown in FIG. 5A, except that the write and read global bit line groups may include four global bit lines, rather than two. In this example, the first write global bit line group GW1 includes write global bit lines WGBL0-WGBL3, the first read global bit line group GR1 includes four read global bit lines RGBL0-RGBL3, the second write global bit line group GW2 includes four write global bit lines WGBL4-WGBL7, and the second read global bit line group GR2 includes read global bit lines RGBL4-RGBL7. As shown in FIG. 5B, adjacent or neighboring write and read global bit line groups GW1 and GR2 are separated by a shielding unit 520, adjacent or neighboring read and write global bit line groups GR1 and GW2 are separated by a shielding unit 540, and adjacent or neighboring write and read global bit line groups GW2 and GR2 are separated by a shielding unit 560. Thus, as shown in FIG. 5B, shielding units 520, 540, and 560 may be arranged between respective global bit line groups.

Referring to FIG. 5C, the semiconductor memory device 500c is similar to the semiconductor memory devices 500a and 500b shown in FIGS. 5A and 5B, except that the write and read global bit line groups may include eight global bit lines, rather than two or four. In this example, the first write global bit line group GW1 includes eight write global bit lines WGBL0-WGBL7, the first read global bit line group GR1 includes eight read global bit lines RGBL0-RGBL7, and the second write global bit line group GW2 includes eight write global bit lines WGBL8-WGBL15. As shown in FIG. 5C, adjacent (or neighboring) write and read global bit line groups GW1 and GR2 are separated by a shielding unit 520, adjacent (or neighboring) read and write global bit line groups GR1 and GW2 are separated by a shielding unit 540, and adjacent (or neighboring) write and read global bit line groups GW2 and GR2 are separated by a shielding unit 560. Thus, as shown in FIG. 5C, shielding units 520, 540, and 560 may be arranged between respective global bit line groups.

In the example embodiment shown in FIG. 5C, each read global bit line RGBL0-RGBL7 may be shared by two or more write global bit lines. The read global bit lines RGBL0-RGBL7 may be positioned between the first write global bit line group GW1 and the second write global bit line group GW2.

Figure 6:
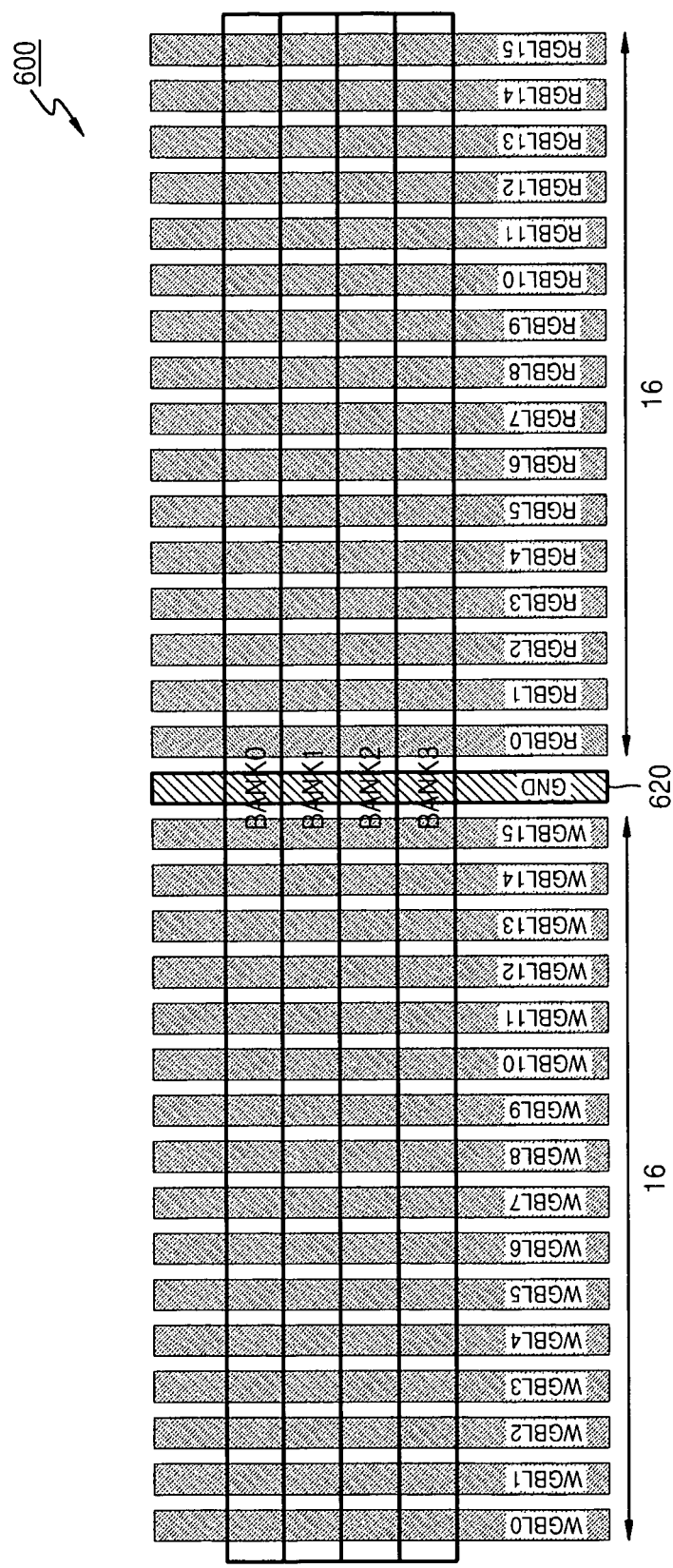
FIG. 6 illustrates a semiconductor memory device according to another example embodiment.

FIG. 6 illustrates a semiconductor memory device according to another example embodiment.

Referring to FIG. 6, the semiconductor memory device 600 may include a plurality of banks arranged in a stack structure, a plurality of write global bit lines WGBL0-WGBL15 and a plurality of read global bit lines RGBL0-RGBL15. The write global bit lines WGBL0-WGBL15 may be positioned relatively close to (e.g., adjacent to or neighboring) one another and the read global bit lines RGBL0-RGBL15 may be positioned relatively close to (e.g., adjacent to or neighboring) one another. In this example, the plurality of read global bit lines RGBL0-RGBL15 and the plurality of write global bit lines WGBL0-WGBL15 are separated by a shielding unit 620. Although not illustrated, each of the write global bit lines WGBL0-WGBL15 and each of the read global bit lines RGBL0-RGBL15 may be alternately positioned. When positioned alternately, a shielding unit may be arranged between each adjacent (or neighboring) write global bit line and read global bit line pair.

The example embodiment in which the plurality of write global bit lines WGBL0-WGBL15 neighbor one another and the plurality of read global bit lines RGBL0-RGBL15 neighbor one another may be advantageous in terms of layout area because only a single shielding unit is necessary. However, a particular layout may be selected considering system specifications and/or resources.

In memory devices (e.g., phase-change memory devices) having write global bit lines and read global bit lines according to example embodiments, a structure to suppress and/or remove coupling noise occurring between neighboring write global bit lines and read global bit lines is described. The structure of a variety of write selection units and read selection units configured to activate a local bit line in the phase-change memory devices having the write global bit lines and the read global bit lines according to the example embodiments will be described below.

Figure 7:
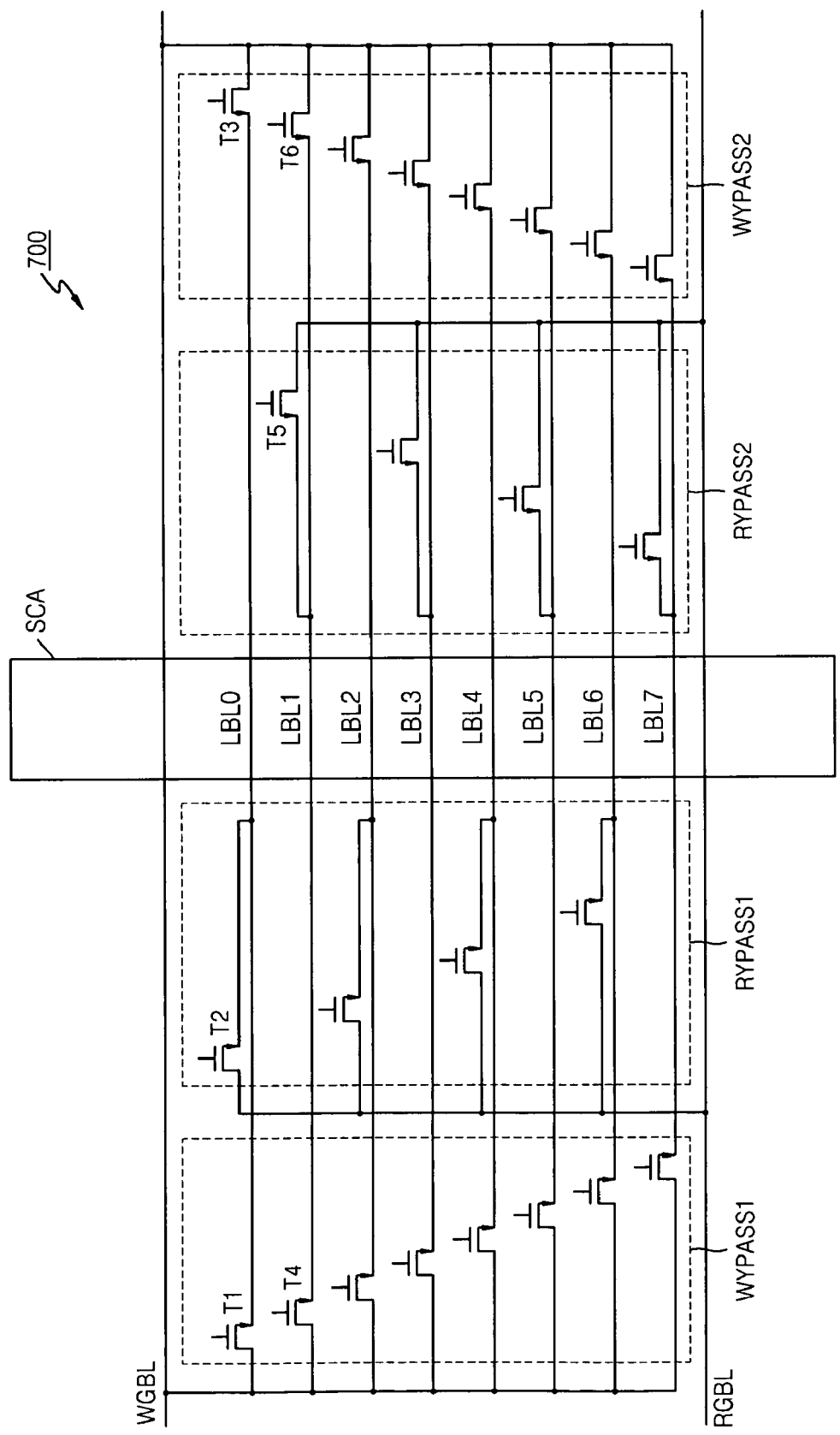
FIG. 7 illustrates a semiconductor memory device according to another example embodiment.

FIG. 7 illustrates a semiconductor memory device according to another example embodiment.

Referring to FIG. 7, the semiconductor memory device 700 may include first selection units WYPASS1, WYPASS2 and second selection units RYPASS1, RYPASS2. The first selection units WYPASS1, WYPASS2 may be configured to activate local bit lines among the plurality of local bit lines LBL0-LBL7 positioned between the write global bit line WGBL and the read global bit line RGBL during a write operation. The second selection units RYPASS1 and RYPASS2 may be configured to activate local bit lines among the plurality of local bit lines LBL0-LBL7 positioned between the write global bit line WGBL and the read global bit line RGBL during a read operation.

In the semiconductor memory device 700, the first selection units WYPASS1 and WYPASS2 may be provided as a pair for each local bit line while the second selection units RYPASS1 and RYPASS2 may be provided one by one for each local bit line. For example, the first selection units WYPASS1 and WYPASS2 may include a plurality of bit line selection units, each of which is connected to a corresponding local bit line. The second selection unit RYPASS1 may include a plurality of second bit line selection units, each of which is connected to a first portion of the local bit lines, and the second selection unit RYPASS2 may include a plurality of second bit line selection units, each of which is connected to a second portion of the local bit lines, wherein the first and second portions of the local bit lines are different ones of the local bit lines. In this example embodiment, the first selection units WYPASS1 and WYPASS2 may be connected at each end of each local bit line, whereas only one of the second selection units RYPASS1 and RYPASS2 is connected to each local bit line.

For example, in FIG. 7 first bit line selection units T1 and T3, each of which is arranged at a respective side of a sub-cell array (SCA), may be connected to the first local bit line LBL0, whereas only second bit line selection unit T2 is connected to the first local bit line LBL0 at one side of the SCA. Similarly, first bit line selection units T4 and T6, each of which is arranged at a respective side of the SCA, may be connected to the second local bit line LBL1, whereas the second bit line selection unit T5, arranged at one side of the SCA, is connected to the second local bit line LBL1.

The first selection units WYPASS1 and WYPASS2 and the second selection units RYPASS1 and RYPASS2 may include a plurality of bit line selection units, which may be transistors (e.g., metal-oxide semiconductor (MOS) transistors). The first bit line selection units may be either PMOS transistors or NMOS transistors, whereas the second bit line selection units may be NMOS transistors. The second bit line selection units used for reading may perform a pre-charging operation before a phase change memory device performs a read operation because the NMOS transistor exhibit better performance than the PMOS transistor in transferring a desired pre-charge voltage to a bit line.

Figure 8:
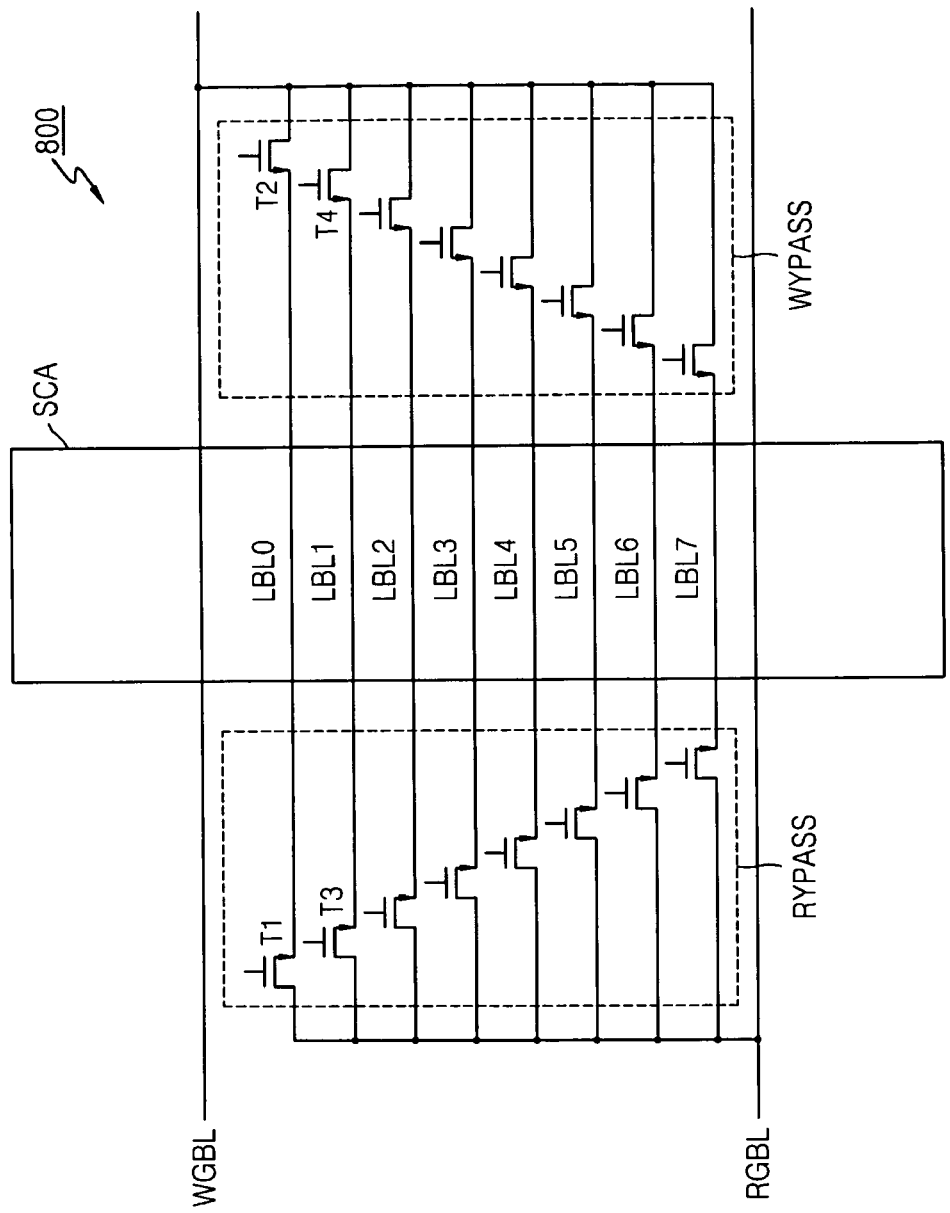
FIG. 8 illustrates a semiconductor memory device according to another example embodiment.

FIG. 8 illustrates a semiconductor memory device according to another example embodiment.

Referring to FIG. 8, the semiconductor memory device 800 may include a first selection unit WYPASS and a second selection unit RYPASS. The first selection unit WYPASS may be connected to the local bit lines LBL0-LBL7 at one side of the sub-cell array SCA, whereas the second selection unit RYPASS may be connected to the local bit lines LBL0-LBL7 at the other side of the sub-cell array SCA.

For example, the first bit line selection unit T2 may be connected to the first local bit line LBL0 at one side of the sub-cell array SCA, and the second bit line selection unit T1 may be connected to the first local bit line LBL0 at the other side of the sub-cell array SCA. Likewise, the first bit line selection unit T4 may be connected to the second local bit line LBL1 at one side of the sub-cell array SCA, and the second bit line selection unit T3 may be connected to the second local bit line LBL1 at the other side of the sub-cell array SCA.

Figure 9:
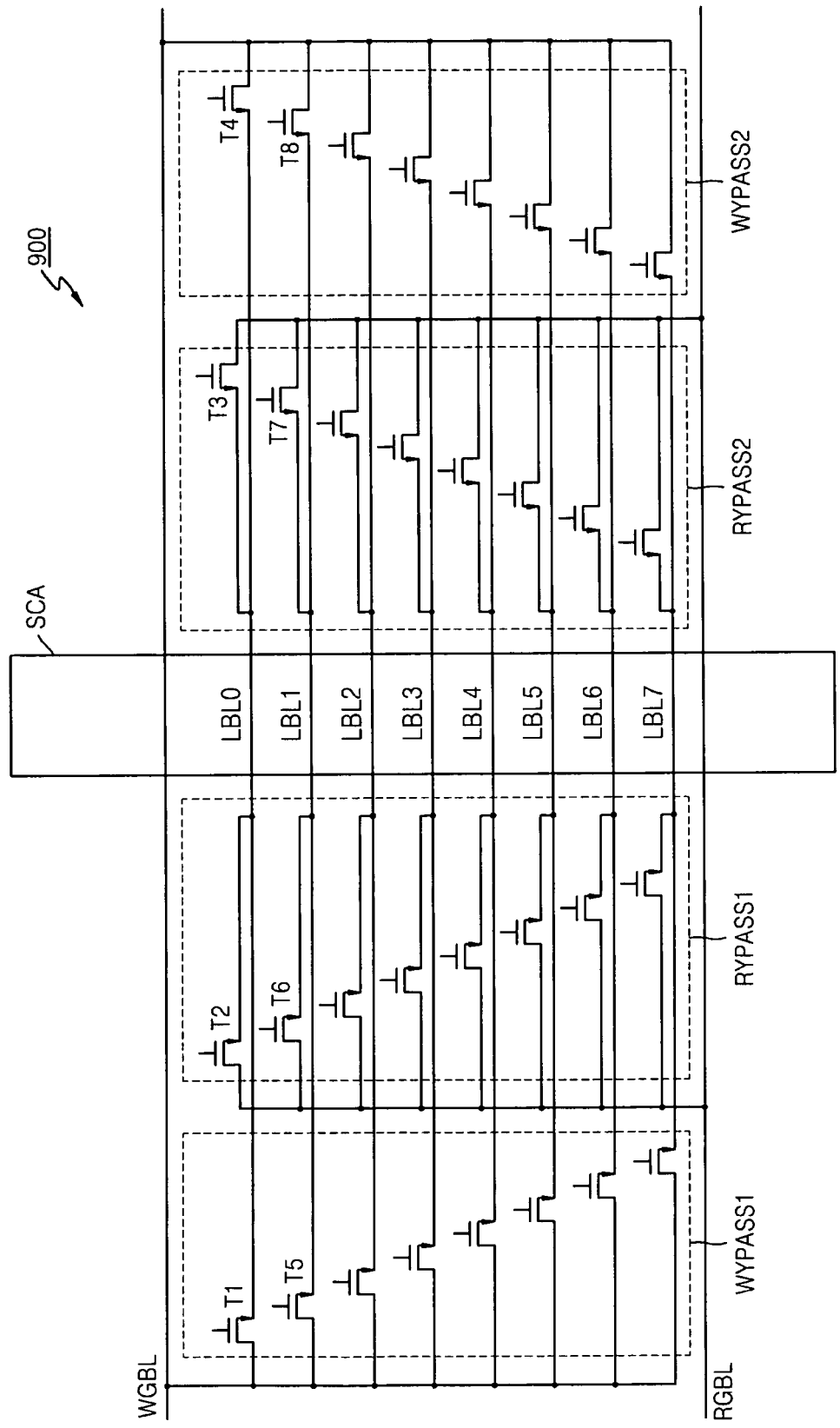
FIG. 9 illustrates a semiconductor memory device according to another example embodiment.

FIG. 9 illustrates a semiconductor memory device according to another example embodiment.

Referring to FIG. 9, the semiconductor memory device 900 may include first selection units WYPASS1 and WYPASS2 and second selection units RYPASS1 and RYPASS2. The first selection units WYPASS1 and WYPASS2 and the second selection units RYPASS1 and RYPASS2 may be arranged at respective sides of the local bit lines LBL0-LBL7 as shown in FIG. 9.

For example, the first bit line selection units T1 and T4 may be connected to the first local bit line LBL0 at opposite sides of the sub-cell array SCA, and second bit line selection units T2 and T3 may be connected to the first local bit line LBL0 at opposite sides of the sub-cell array SCA. Similarly, first selection units T5 and T8 may be connected to the second local bit line LBL1 at opposite sides of the sub-cell array SCA, and second selection units T6 and T7 may be connected to the second local bit line LBL1 at opposite sides of the sub-cell array SCA.

Figure 10:
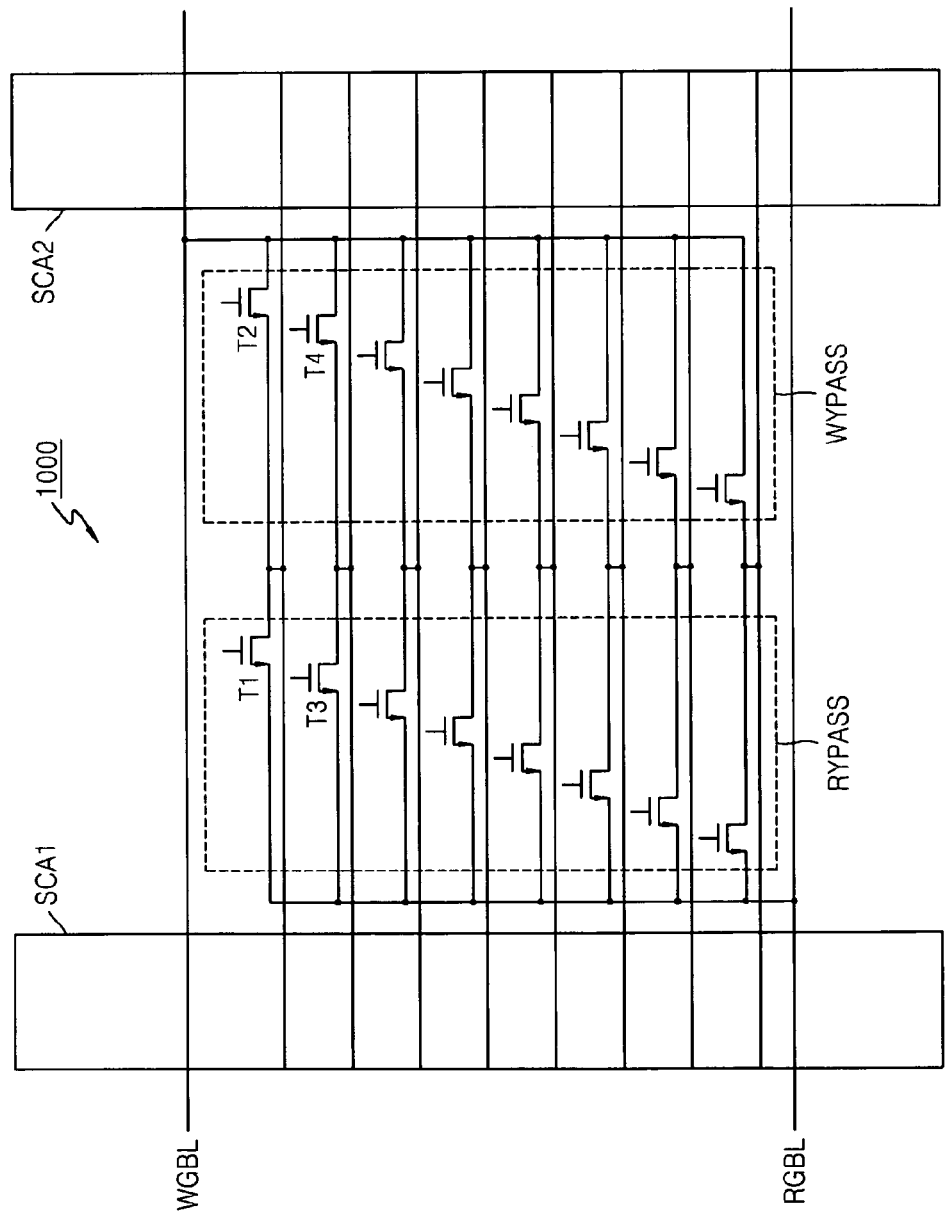
FIG. 10 illustrates a semiconductor memory device according to another example embodiment.

FIG. 10 illustrates a semiconductor memory device according to another example embodiment.

Referring to FIG. 10, the semiconductor memory device 1000 may include a plurality of memory cells connected to a plurality of local bit lines. For example, the semiconductor memory device 1000 may include a first sub-memory cell array SCA1 and a second sub-memory cell array SCA2. A first selection unit WYPASS and a second selection unit RYPASS may be arranged between the sub-memory cell arrays SCA1 and the SCA2.

In this example embodiment, the first local bit line LBL0 may be connected to the first bit line selection unit T2 and the second bit line selection unit T1 arranged between the sub-memory cell arrays SCA1 and the SCA2. Similarly, the second local bit line LBL1 may be connected to the first bit line selection unit T4 and the second bit line selection unit T3 arranged between the sub-memory cell arrays SCA1 and the SCA2.

Semiconductor memory devices other according to other example embodiments may have a variety of numbers and arrangements of the first and second selection units. For example, although in FIG. 10 both of the first and second selection units are described as being arranged between the first and second sub-memory cell arrays SCA1 and SCA2, one of the first and second selection units may be arranged at an other side of the SCA1 or SCA2. Of various example embodiments, a designer may select an arrangement of first selection units (e.g., write selection units) and second selection units (e.g., read selection units) considering factors such as a layout size and/or an operational characteristics required by a semiconductor memory device.

Although example embodiments are described herein with respect to a phase-change random access memory, example embodiments may be implemented and/or use in conjunction with other types of non-volatile memory devices such as, resistive random access memory (RRAM) or the like.

While example embodiments have been particularly shown and described with reference to the example embodiments shown in the drawings, it will be understood that various changes in form and details may be made therein without departing from the spirit and scope of the following claims.

What is claimed is:

1. A semiconductor memory device, comprising:
   at least one write global bit line connected to a plurality of local bit lines; and
   at least one read global bit line connected to the plurality of local bit lines,
   wherein the at least one write global bit line includes a plurality of write global bit lines, and the at least one read global bit line includes a plurality of read global bit lines, at least one write global bit line among the plurality of write global bit lines and at least one read global bit line among the plurality of read global bit lines being adjacent to one another, and
   the adjacent write global bit line and read global bit line are separated by a first distance, the first distance being longer than one of a second distance separating adjacent write global bit lines among the plurality of write global bit lines and a third distance separating adjacent read global bit lines among the plurality of read global bit lines.

2. The semiconductor memory device of claim 1, further comprising:
   a plurality of memory banks connected to the plurality of local bit lines, the plurality of memory banks being arranged in a stack structure.

3. The semiconductor memory device of claim 1, wherein the memory device is a phase change memory device.

4. A semiconductor memory device, comprising:
   at least one write global bit line connected to a plurality of local bit lines; and
   at least one read global bit line connected to the plurality of local bit lines,
   wherein the at least one write global bit line includes a plurality of write global bit lines, the plurality of write global bit lines being arranged into at least two groups of adjacent write global bit lines, the at least two groups of adjacent write global bit lines being separated from one another by the at least one read global bit line, which is positioned between the at least two groups of write global bit lines.

5. The semiconductor memory device of claim 4, further comprising:
   a shielding unit arranged between adjacent ones of the at least one write global bit lines and at least one read global bit lines.

6. The semiconductor memory device of claim 5, wherein a ground voltage is applied to the shielding unit.

7. The semiconductor memory device of claim 5, wherein a power voltage or a boosted voltage is applied to the shielding unit.

8. A semiconductor memory device, comprising:
   at least one write global bit line connected to a plurality of local bit lines;
   at least one read global bit line connected to the plurality of local bit lines;
   a first bit line selection unit configured to activate at least one local bit line during a write operation; and
   a second bit line selection unit configured to activate at least one local bit line during a read operation,
   wherein each local bit line is connected to a pair of first selection units, but only a single second selection unit.

9. The semiconductor memory device of claim 8, wherein the first selection units in the pair of first selection units are arranged at opposite ends of the local bit lines.

10. A semiconductor memory device, comprising:
    at least one write global bit line connected to a plurality of local bit lines;
    at least one read global bit line connected to the plurality of local bit lines;
    a first bit line selection unit configured to activate at least one local bit line during a write operation; and
    a second bit line selection unit configured to activate at least one local bit line during a read operation;
    wherein the first selection unit includes a plurality of first bit line selection units, each of the plurality of first bit line selection units being connected to a corresponding one of the plurality of local bit lines,
    the second selection unit includes a plurality of second bit line selection units, each of the plurality of second bit line selection units being connected to a corresponding one of the plurality of local bit lines, and
    the plurality of local bit lines are connected to a plurality of memory cells, the plurality of memory cells being grouped into a first sub-memory cell array and a second sub-memory cell array, the first selection unit and the second selection unit being positioned between the first sub-memory cell array and the second sub-memory cell array.

11. A semiconductor memory device, comprising:
    at least one write global bit line connected to a plurality of local bit lines;
    at least one read global bit line connected to the plurality of local bit lines;
    a first bit line selection unit configured to activate at least one local bit line during a write operation; and
    a second bit line selection unit configured to activate at least one local bit line during a read operation,
    wherein a pair of first selection units and a pair of second selection units are connected to each of the plurality of local bit lines.

12. The semiconductor memory device of claim 11, wherein each of the first selection units in the pair of first selection units is arranged at an opposite side of the plurality of local bit lines, and each of the second selection units in the pair of second selection units is arranged at an opposite side of the plurality of local bit lines.

* * * * *